US010530402B2

(12) United States Patent
Chakraborty

(10) Patent No.: US 10,530,402 B2
(45) Date of Patent: *Jan. 7, 2020

(54) WIDEBAND LOW DISTORTION POWER AMPLIFIER

(71) Applicant: TEXAS INSTRUMENTS INCORPORATED, Dallas, TX (US)

(72) Inventor: Sudipto Chakraborty, Plano, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 16/380,582

(22) Filed: Apr. 10, 2019

(65) Prior Publication Data

US 2019/0305808 A1   Oct. 3, 2019

Related U.S. Application Data

(63) Continuation of application No. 16/148,891, filed on Oct. 1, 2018, now Pat. No. 10,291,270, which is a continuation of application No. 15/008,871, filed on Jan. 28, 2016, now Pat. No. 10,116,340.

(51) Int. Cl.
*H04B 1/04* (2006.01)
*H03F 3/24* (2006.01)

(52) U.S. Cl.
CPC ........... *H04B 1/0475* (2013.01); *H03F 3/24* (2013.01); *H04B 2001/045* (2013.01)

(58) Field of Classification Search
CPC .... H04B 1/0475; H04B 2001/045; H03F 3/24
See application file for complete search history.

(56) References Cited

U.S. PATENT DOCUMENTS

| 8,489,042 B1* | 7/2013 | Hietala | H04B 1/0475 455/114.3 |
| 2005/0189990 A1* | 9/2005 | Mizuta | H03F 1/3247 330/52 |
| 2009/0264089 A1* | 10/2009 | Suzuki | H03F 1/3252 455/114.3 |
| 2013/0082775 A1* | 4/2013 | Matsumoto | H03F 1/3247 330/149 |
| 2014/0273883 A1* | 9/2014 | Chakraborty | H04B 1/0458 455/73 |
| 2016/0043754 A1* | 2/2016 | Robert | H04B 1/0475 455/114.3 |

* cited by examiner

*Primary Examiner* — Freshteh N Aghdam
(74) *Attorney, Agent, or Firm* — Ronald O. Neerings; Charles A. Brill; Frank D. Cimino

(57) ABSTRACT

A circuit and apparatus for filtering harmful harmonics is disclosed. The circuit and apparatus include a power amplifier core that uses equally sized inverter based amplifiers. The amplifier core cells provide uniform load to all phases of a fundamental frequency to cancel all harmonics at an output. The power amplifier stages are driven into nonlinearity, and the combination of harmonics is performed at the output by varying series connected capacitors. The harmonic combination is performed at the outputs, leaving no further scope of nonlinearity in the signal chain.

24 Claims, 5 Drawing Sheets

WIDEBAND LOW DISTORTION POWER AMPLIFIER

This application is a Continuation of application Ser. No. 16/148,891 filed Oct. 1, 2018, which is a Continuation of application Ser. No. 15/008,871 filed Jan. 28, 2016, now U.S. Pat. No. 10,116,340.

TECHNICAL FIELD

This disclosure relates generally to the field of out-of-band harmonic filtering and more specifically to harmonic filtering in communication networks.

BACKGROUND

In electronic systems, input signals are processed through various components before they are available as an output signal as desired. Due to various imperfections of electronic components, harmonics of the input signal are generated at the output. Harmonics are manifested in output currents and voltages at integer multiples of the fundamental frequency of the input signal. Harmonics can cause signal distortions and can lead to malfunctioning of electronic systems resulting in downtime and increased operating costs. In communication systems especially wireless communication systems, harmonics can distort data resulting in incorrect data interpretation.

To eliminate harmonics, various harmonic filtering techniques are used to filter out undesired harmonics and generate clean signal. Typically, harmonic filters are added towards the end of the circuit to capture or 'trap' harmonics and filter undesired output signals at multiples of the fundamental frequency. These filters add extra cost for manufacturing of electronic systems and for high volume manufacturing, harmonic filters become cost prohibitive.

In wireless communication, to communicate over long distance using a communication device such as a cellular phone, high output power amplifiers are needed; however, to comply with FCC regulations, strong out-of-band filtering is employed using external components in the communication devices for impedance conversion. Traditional solutions realize high efficiency transmitters by driving transmitters near rail waveforms and use many external components to filter out harmonics of the fundamental tone. This solution typically requires a high voltage transistor to sustain high waveform swing and many externals components to filter out harmonics which increases the losses. These external components are highly undesirable in the communication device because they add cost and use up significant battery power. Ideally, electronic systems need to be designed such to avoid undesired harmonics in the output signal and reduce the cost of products.

SUMMARY

In accordance with an embodiment, a circuit is disclosed. The circuit includes a frequency oscillator for generating a fundamental signal frequency, a frequency divider coupled to the frequency oscillator and configured to divide the fundamental signal frequency to generate one or more phases of the fundamental signal frequency, a power amplifier coupled to the frequency divider and configured to, receive the fundamental signal frequency and the one or more phases, and cancel harmonic frequencies of the fundamental signal frequency.

In accordance with another embodiment, an apparatus is disclosed. The apparatus includes a frequency oscillator for generating a signal frequency, a frequency divider coupled to the frequency oscillator and configured to divide the signal frequency to generate one or more equally spaced phases of the signal frequency, a power amplifier coupled to the frequency divider and configured to, receive the one or more phases of the signal frequency, and cancel harmonics of the signal frequency, wherein one or more of the frequency oscillator and the frequency divider are programmable to generate a plurality of signal frequencies and a plurality of phases at a fundamental frequency of the signal frequency respectively.

In accordance with yet another embodiment, a device is disclosed. The device includes a transceiver, and a processing unit coupled to the transceiver, wherein the transceiver is configured to receive a reference phasor signal at a fundamental signal frequency and one or more equally spaced phasors at the fundamental signal frequency, provide uniform load to each one of the phasor at the fundamental signal frequency and cancel the one or more harmonic frequencies of the fundamental signal frequency.

DETAILED DESCRIPTION

The following description provides many different embodiments, or examples, for implementing different features of the subject matter. These descriptions are merely for illustrative purposes and do not limit the scope of the invention.

Figure 1:
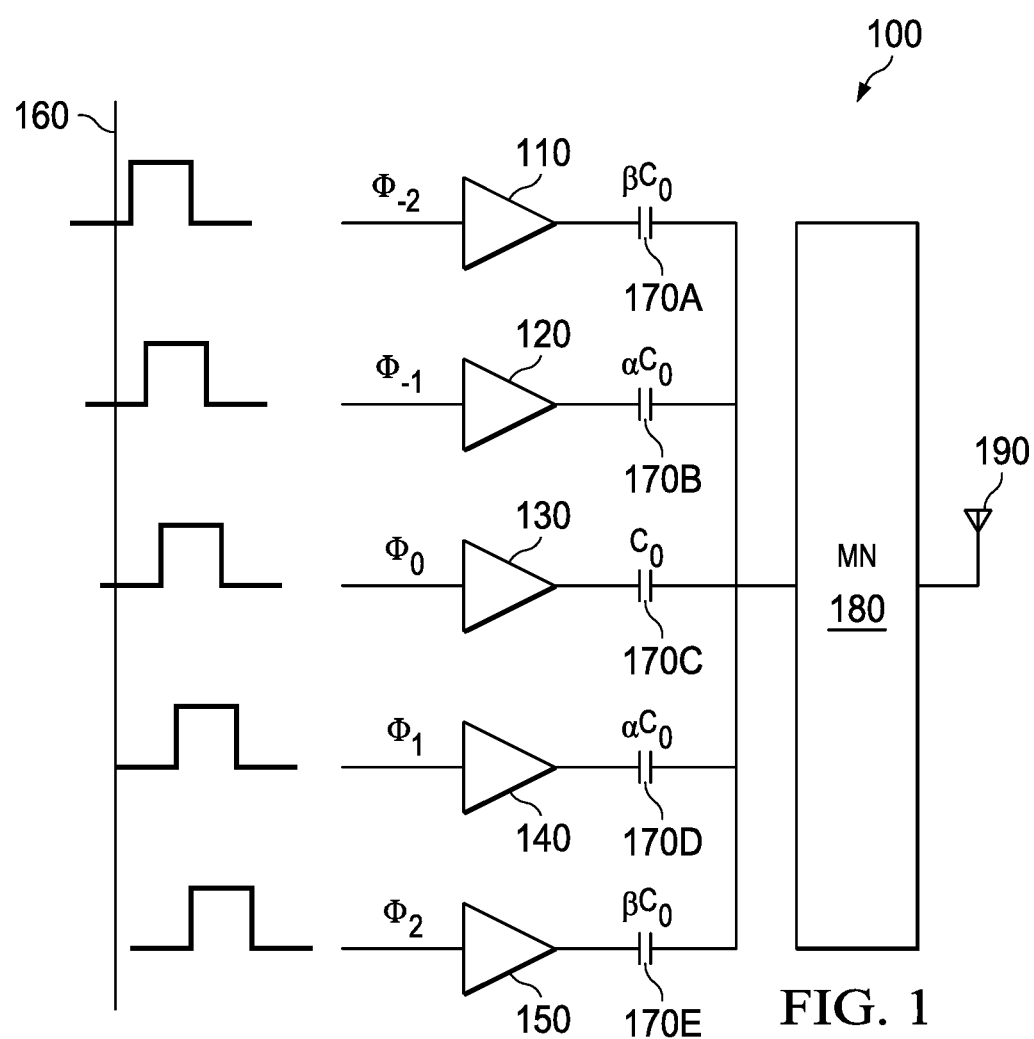
FIG. 1 illustrates an exemplary system for managing harmonics according to an embodiment.

Referring to FIG. 1, an exemplary system 100 for managing harmonics is illustrated according to an embodiment. System 100 includes inverter based wideband lower distortion power amplifiers 110-150. For purposes of simplification, five power amplifiers are illustrated; however, the system in not in any way limited to the illustrated number of power amplifiers. Depending on the number of halmonics to be processed, the number of power amplifiers can be increased or decreased accordingly. Power amplifier 130 receives the input signal 160 with a phase $\Phi_0$ of a fundamental frequency $f_0$ of input signal 160. Power amplifiers 110 and 120 receive signals with phases $\Phi_{-1}$ and $\Phi_{-2}$ of the fundamental frequency $f_0$ respectively. Similarly, power amplifiers 140 and 150 receive signals with phases $\Phi_1$ and $\Phi_2$ of the fundamental frequency $f_0$ respectively. The phase $\Phi_1$ is complement of the phase $\Phi_{-1}$ in such that when they are subjected to a uniform load and then combined, they cancel all the harmonics. Similarly $\Phi_2$ is complement of $\Phi_{-2}$ and so on.

Each power amplifier is coupled to an output capacitor 170a-e for weighting respective phasor components. For example, power amplifier 130 is coupled to capacitor 170c with capacitance $C_0$, power amplifiers 110 and 120 are coupled to capacitors 170a and 170b with capacitance $\beta C_0$ and $\alpha C_0$ respectively. Similarly, power amplifiers 140 and 150 are coupled to capacitors 170d and 170e with capacitance $\alpha C_0$ and $\beta C_0$ respectively. The combined output of capacitors 170a-e is then processed by the matching network 180 before transmitting the signal via antenna 190. Matching network is formed using lossless reactive components (i.e. inductors, capacitors, or the like) to transform required impedance for delivering optimum power to the antenna impedance. In an embodiment, the typical impedance of the antenna is about 50Ω. The output of capacitors 170a-e are combined thus harmonics of the input signal 160 are canceled before the signal is processed by the matching network and thus the signal does not require additional harmonic filtering prior to the transmission, and other matching networks maybe utilized along with antennas that are relatively insensitive to the variation in the surrounding environment.

The core of power amplifiers 110-150 uses equally sized inverter/buffer type limiting amplifiers providing equal load per phase of the fundamental carrier frequency and it is driven by N phases of the fundamental carrier. The pull-up (PMOS) and pull-down (NMOS) transistors in each of the inverter/buffer type stages utilize similar or same width and length dimensions, which allows them to provide equal load per phase of the fundamental carrier frequency. In the exemplary illustrated embodiment, N=5; however, as explained hereinabove, the number of power amplifier stages can be based on the number of harmonics to be processed, and may include an even number of stages as well. The core cells of power amplifiers 110-150 provide substantially constant load to all phases of the fundamental frequency of the input signal so that harmonics of the fundamental frequency are cancelled at the output. The load of the power amplifiers 110-150 (inductive, or capacitive) can be designed such that each phase of the fundamental frequency is subject to uniform output load and thus the harmonics are cancelled out at the output when all phases are combined. For example, if the reference phase $\Phi_0$ of the fundamental frequency $f_0$ and the two equally spaced phases in the opposite direction $\Phi_1$ and $\Phi_{-1}$ of the fundamental frequency $f_0$ are combined with respect to a pre-determined scaling factor, then they constructively combine energy at the fundamental frequency, and destructively nullify energy at the harmonic frequencies leaving a clean output signal at the fundamental frequency $f_0$.

Figure 2:
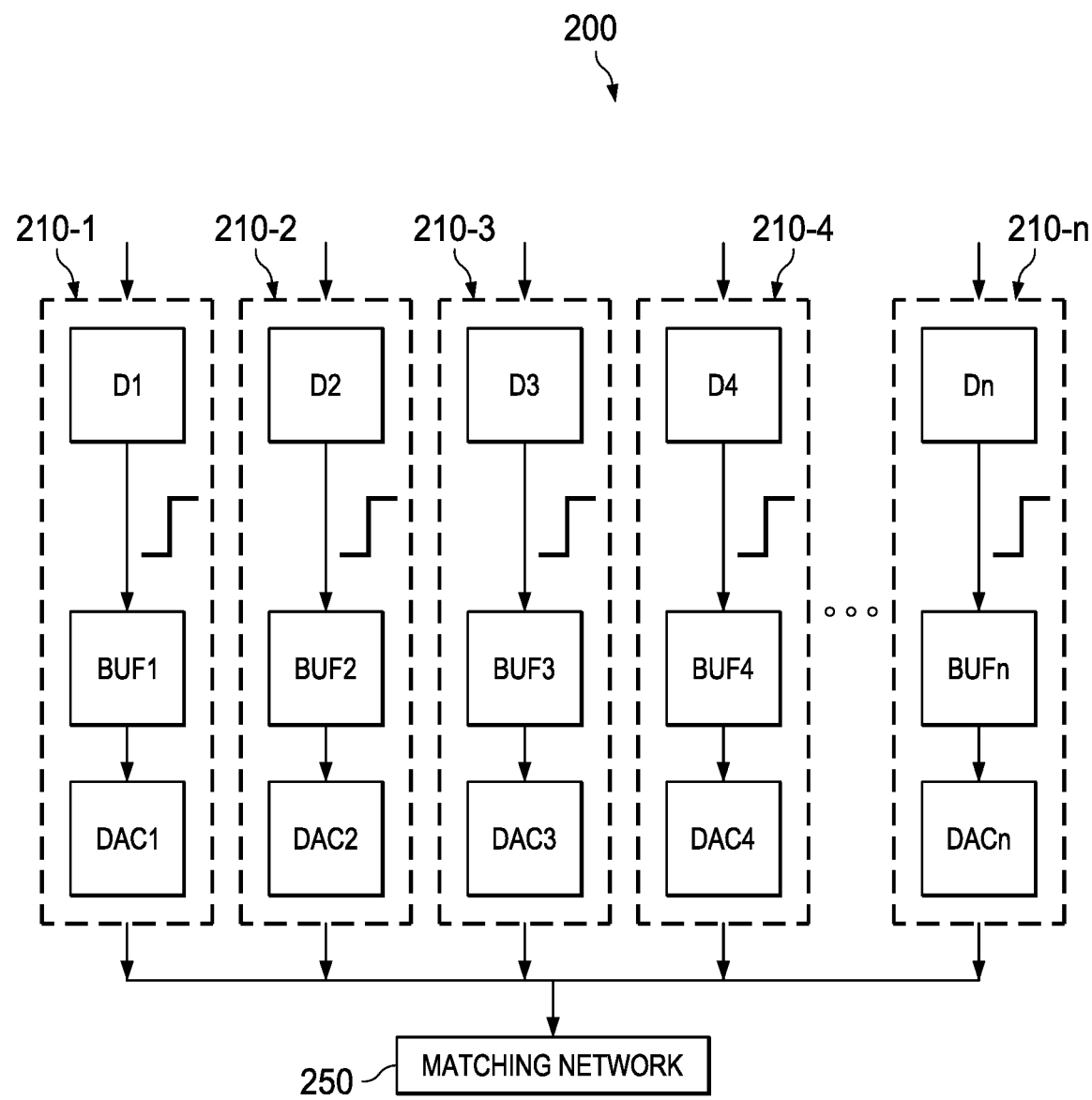
FIG. 2 illustrates an exemplary system with implementation of wideband low distortion power amplifiers according to another embodiment.

Referring to FIG. 2, an exemplary system 200 with implementation of wideband low distortion power amplifiers is illustrated according to another embodiment. The system 200 includes power amplifiers 210-1 to 210-n. The number 'n' can be selected based on the design choice for harmonic cancellation for example, if the design choice is to cancel two positive and two negative harmonics, the system 200 will include five power amplifiers including one for the fundamental frequency. The 'n' phases are derived from the input signal working at 'n' times the fundamental frequency. Each phase signal is first divided by divider elements D1-n and then is buffered by buffers BUF1-n. The buffered signals are then processed by digital to analog converters DAC1-n. The buffers BUF1-n are designed to isolate DACs and the divider stages and typically contain more than one stage of inverters or buffers. In the present example, input signals are fully differential and each signal phase sees the same loading to DACs. Further, in the present example, the DAC stages are weighted to provide harmonic nulls at (2n+1) times the center frequency of the fundamental carrier; however, any other weighting scheme can be used based on any particular given implementation. In the exemplary embodiment, an odd number of stages are illustrated; however, an even number of stages may also be used along with the programmability.

The power amplifier stages are driven into nonlinearity and the combination of signals is performed at the output by varying the value of series connected reactive elements (in this specific example, capacitors). When 'n' is increased, significant harmonic suppression can he obtained, thereby eliminating the need of external filtering networks and harmonic traps. Because the harmonic combination occurs at the output, this leaves no further nonlinearity in the signal chain. Optionally, to reject higher order harmonics that are not addressed by the power amplifier stages, harmonic traps may be used at the output. The power amplifier stages and drivers use inverter based topology, tapered from the divider to the driver and are scaled from each other. This approach offers both, high linearity and high efficiency using the same architecture. Further, it can offer a wide band operation by changing the center frequency of the signal by changing the divider ratio. This also eliminates need for external components for harmonic filtering thus reducing the product cost.

Figure 3:
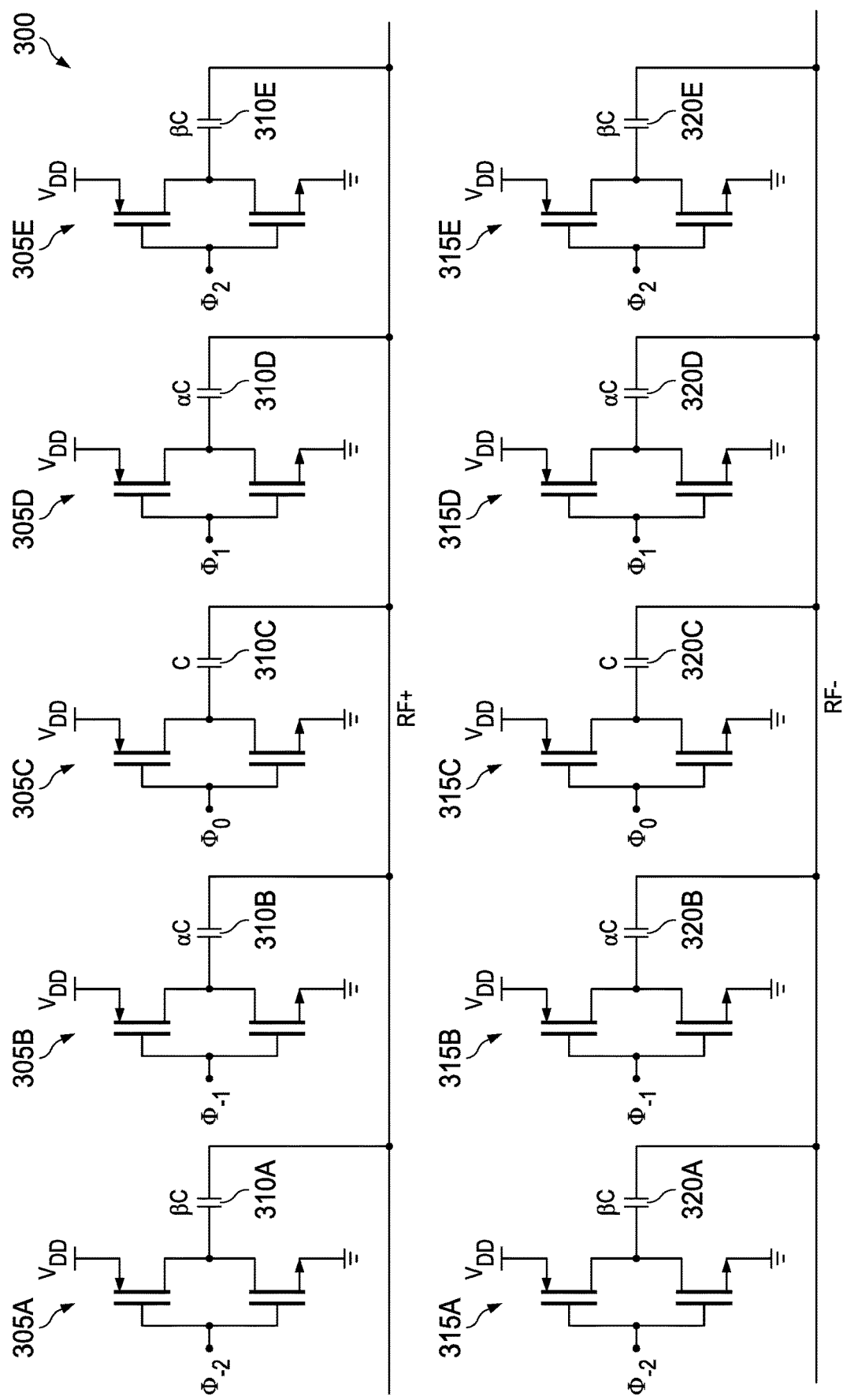
FIG. 3 illustrates an exemplary implementation system for digital-to-analog converters (DAC) according to another embodiment.

Referring to FIG. 3, another exemplary implementation system 300 for digital-to-analog converters (DAC) is illustrated according to another embodiment. In the exemplary implementation, system 300 includes five DACs 310A-E along with respective inverter/buffer pair 305A-E for positive cycle of an incoming signal for example, a radio frequency (RF) signal, and five DACs 320A-E along with respective inverter/buffer pair 315A-E for negative cycle of the RF signal. In the exemplary embodiment, the DACs are illustrated as capacitors along with respective inverters/buffers; however, any other reactive components can be used as DACs with appropriate inverters/buffers. Typically, in harmonic cancellation application, DACs are weighted with respect to a pre-determined sine/cosine waveform and are different from traditional binary or thermometer weighting. In another embodiment, the combination of inverter/buffer and capacitor can be used as a "hybrid-weighted DAC" where the active elements (transistor based inverter/drivers) are equally weighted, as explained hereinabove, and the reactive elements (capacitors/inductors) are weighted according to trigonometric function.

For explanation purposes, five pairs of DACs with inverter/buffers are shown; however, the number of DACs can be any number 'N' according to any design implementation choice based on the number and/or type of harmonics to be canceled. Each one of the inverter/buffer pair 305A-E and 315A-E is powered by a power supply VDD and is coupled to corresponding DAC 310A-E and 320A-E with capacitance C, $\alpha$C, and $\beta$C as illustrated similar to ones in FIG. 1. Each one of the DACs 310A-E receive selected phase of the input RF signal for example, DAC 310C receives the positive cycle of the fundamental frequency or tone of the RF signal, DACs 310A-E receive the first and second harmonics of the positive cycle that are prior to the fundamental frequency of the RF signal respectively, and DACs 310D-E receive the first and second harmonics of the positive cycle that are after the fundamental frequency of the RF signal respectively. Similarly, DACs 320A-E receive the negative cycles of the fundamental frequency and its corresponding harmonics of the input RF signal.

In the exemplary implementation, DACs 310 and 320 are illustrated using the transistor elements; however, one skilled in the art will appreciate that DACs 310 and 320 can also be implemented using other passive components such as for example, an inductive element. An inductive coil with various taps can be used as DACs 310 and 320 to select the fundamental frequency and its harmonics. DACs 310 and 320 can be configured using passive components such as, inductors, and/or capacitors and therefore they can also be implemented as part of the matching networks 180 or 250 as illustrated in FIGS. 1&2. Further, because DAC components are passive, they provide exceptional phase accuracy and do not cause any harmonic degradation. Passive DACs 310 and 320 use low-loss reactive elements, and can be configured to withstand high voltage or current handling capabilities, leading to high output power. This enables the scalability of the proposed technique, and the efficiency of a system using the DAC system 300 is maximized and scalable, both at the same time. Further, this enables reconfigurability of the proposed scheme for multiple wireless standards.

The power supply VDD for each one of the buffer/inverter 305A-E and 315A-E can be implemented as variable power supply to compensate for any mismatch in the output of the system for example, if some of the harmonics of the fundamental frequency are 'leaked' into output, then at initial calibration stage, the VDD for respective harmonics can be adjusted to ensure that the particular harmonics is completely canceled at the output. One skilled in the art can appreciate that the power supply VDD can he adjusted using various component combinations such as variable resistor network or the like implementation to adjust the input power supply as desired.

Typically, harmonics of the fundamental frequency are measured by keeping a frequency synthesizer (not shown) at the same frequency as of the system for example, if the system is a transmitting unit, then the frequency synthesizer can have the same frequency as the transmitter (TX). For an implementation using six phase cancellation, a 6-stage delay ran be used to generate all six phases of the fundamental frequency. Similarly, an 'N' stage delay can be used to generate 'N' phases of the fundamental frequency for any given implementation. In the exemplary embodiment, multiple clock phases are used at low supply voltage, thereby making it suitable for integration with low supply voltage DC-DC converters in any particular implementation. Further, the exemplary implementation uses low voltage transistors, which allows a lower power implementation in any system. Using the exemplary implementation, the entire harmonic filtering can be done inside a chip thus avoiding the use of off-chip additional harmonic traps and filtering using external components. The exemplary implementation leads to a low-cost solution and it can also be implemented in a system with low quality factor of antennas such as the ones typically used in automotive and similar applications.

Figure 4:
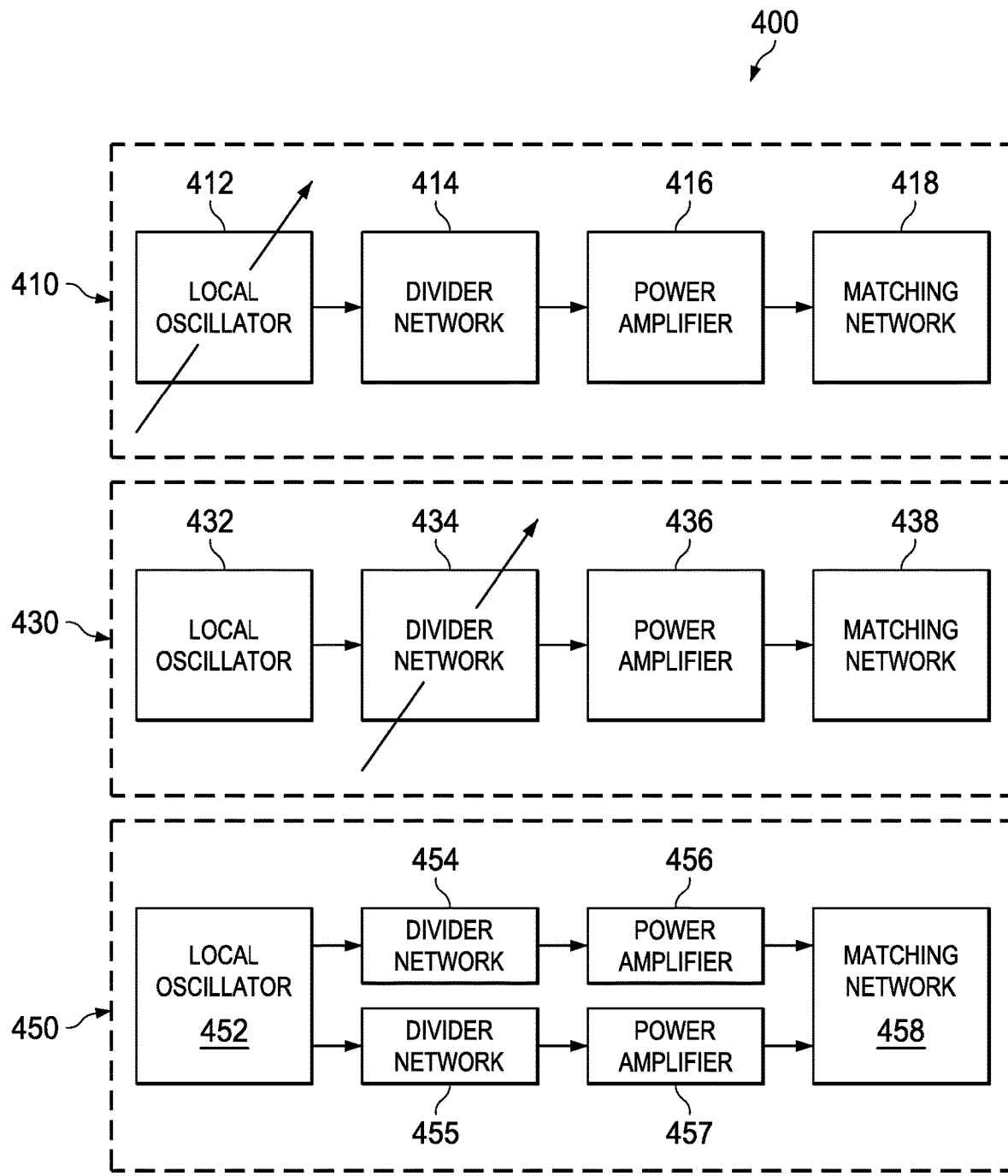
FIG. 4 illustrates various exemplary multi-band implementations of wideband low distortion power amplifier according to another embodiment.

Referring to FIG. 4, various exemplary multi-band implementations 400 of wideband low distortion power amplifier are illustrated according to an embodiment. Implementation 410 includes a local oscillator 412, a divider network 414, a power amplifier 416, and a matching network 418. In this exemplary implementation, the local oscillator 412 is variable and configured to tune to multiple frequencies to cover wide range of frequencies. The divider network 414 can be any network configured to divide the local oscillator 412 frequency to the desired number 'N' of harmonics. The power amplifier 416 and matching network 418 can be similar to the ones illustrated in FIGS. 1&2.

Implementation 430 is another illustration of the application of power amplifier for harmonic filtering according to another embodiment. Implementation 430 includes a local oscillator 432, a divider network 434, a power amplifier 436, and a matching network 438. In this particular implementation, the local oscillator 432 is configured to provide a fixed specific center frequency. The divider network 434 is programmable by enabling or disabling the ring of delay stages thus creating multiple phases of the center frequency. For example, an odd integer divider by (2n+1) can be created by connecting (2n+1) equal delay stages and programmed to (2n−1) by shorting out two of the stages of the delay cell ring. As stated hereinabove, an even number of stages may also be used in addition to the reconfigurability as well. The power amplifier 436 and matching network 438 can be similar to the ones illustrated in FIGS. 1&2.

Implementation 450 is yet another illustration of the application of power amplifier for harmonic filtering according to another embodiment. Implementation 450 includes a local oscillator 452, two divider networks 454 and 455, two power amplifiers 456 and 457, and a matching network 458. In implementation 450, input signal such as for example a RF signal from the local oscillator 452 is provided to both fixed divider networks 454 and 454. Each divider network 454 and 455 interfaces with corresponding power amplifier 456 and 457 respectively. Outputs from power amplifiers 456 and 457 are combined together in the matching network 458 similar to as illustrated in FIGS. 1&2. In this implementation, one chain may be active at a particular given time. This implementation provides a wide range of frequency coverage with the use of multiple divider networks. For explanation, in this exemplary illustration only two divider networks are shown; however, multiple divider networks can be used based on the design implementation choice and the range of frequencies to be covered.

Figure 5:
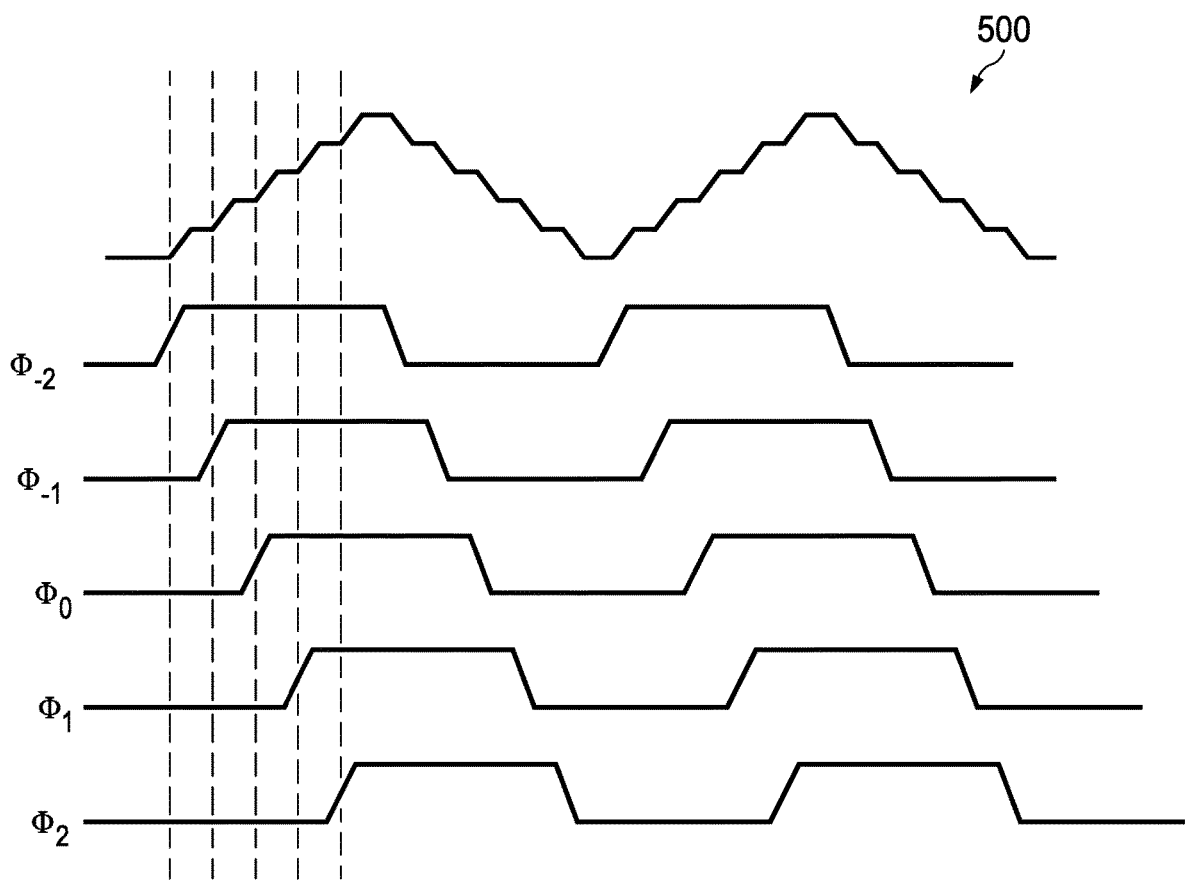
FIG. 5 illustrates an exemplary output waveform generated using the wideband low distortion power amplifier according to another embodiment.

Referring to FIG. 5, an exemplary output waveform 500 generated using the wideband low distortion power amplifier is illustrated according to an embodiment. The waveform 500 is generated using N=5 implementation with five power amplifiers similar to the ones illustrated in FIGS. 1&2. In this particular implementation, five phases of the fundamental frequency are used to generate the near sinusoidal output waveform 500. The waveform 500 is generated using a reference phase $\Phi_0$ of fundamental frequency $f_0$ and four other phases $\Phi_{-1}$, $\Phi_{-2}$, $\Phi_1$, and $\Phi_2$. A weighted sum of five phasors leads to the formation of a sinusoidal wave shape 500. In the present example, the number of phasors is N=5; however, as stated hereinabove, any number phasors or harmonics 'N' can be used based on any particular given implementation. A higher 'N' further smoothens the sinusoidal waveform shape 500 while increasing the power use and additional components in the circuit.

Figure 6:
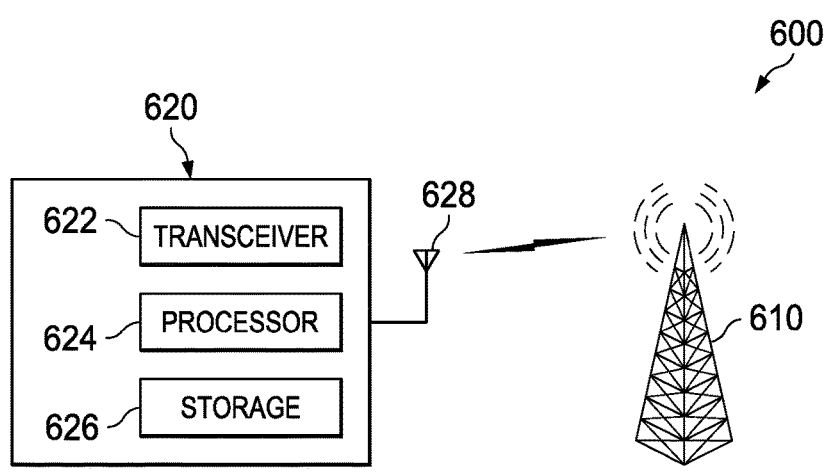
FIG. 6 illustrates an exemplary wireless network using the wideband low distortion power amplifier according to another embodiment.

Referring to FIG. 6, an exemplary wireless network 600 is illustrated according to another embodiment. Network 600 includes a network element 610. The network element 610 can be any wireless communication network element for example, a base station, an access point, a network relay, a network extender, a wireless router, or any other device capable of connecting to a network and provide wireless communication connections to various devices. The network 600 further includes a wireless communication device 602. The wireless communication device 620 can be any device such as for example, a cell phone, a laptop computer, a personal digital assistant device (PDA), or the like. The network 600 can also include many other devices capable of wirelessly communicating with the network element 610 such as control systems, printers, consumer electronic devices, and various other devices and systems.

The wireless communication device 620 includes various system components such as a transceiver 622, a processor 624, storage devices 626, and an antenna 628. The device 620 can include various other components like displays, keyboards, multiple antennas, and the like (not shown). The network 600 can be based on any single or combination of protocols such as cellular, WiFi, Bluetooth, and various other wireless communication protocols. When wireless devices such as device 620 has data to communicate, then the wireless device 620 processes the data and modulates it into a carrier frequency that its transceiver uses to transmit data to the network element 610 or to any other network device in the network 600.

When the wireless device 620 processes the data and uses a particular frequency to modulate and transmit data, it may encounter challenges of harmonics of the carrier frequency, which may impact the performance of the wireless device transmission and regulatory compliance. The wireless device 620 may include a wideband low distortion power amplifiers circuit illustrated in FIGS. 1&2 to manage the carrier harmonics and transmit a clean signal based only on the designated carrier frequency for transmission. Using the wideband low distortion power amplifiers circuit according to an embodiment allows the wireless device to transmit data with minimum distortion and significantly mitigates the harmonic problem in the transmission.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims. Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

Moreover, "exemplary" is used herein to mean serving as an example, instance, illustration, etc., and not necessarily as advantageous. Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources etc), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A circuit comprising:
   a frequency divider configured to divide a fundamental signal frequency to generate one or more phases of the fundamental signal frequency;
   a power amplifier coupled to the frequency divider, respective amplifier stages of the power amplifier configured to receive the fundamental signal frequency and the one or more phases; and
   an output coupled to the respective amplifier stages of the power amplifier.

2. The circuit of claim 1, wherein the power amplifier further provides uniform output load to the fundamental signal frequency and one or more harmonic frequencies.

3. The circuit of claim 1, wherein the power amplifier further comprises:
   one or more buffers configured to buffer one or more of the fundamental signal frequency and harmonic frequencies; and
   one or more digital-to-analog converters (DAC) coupled to the one or more buffers and configured to combine the fundamental signal frequency and the one or more phases of the fundamental signal frequency.

4. The circuit of claim 3, wherein the DACs are configured using passive components.

5. The circuit of claim 3, wherein the DACs are further configured to provide a uniform output load to each one of the phases of the fundamental signal frequency.

6. The circuit of claim 5, wherein each one of the buffers is coupled to a corresponding power supply.

7. The circuit of claim 6, wherein the power supply is a variable power supply and configured to one or more of change power supplied to corresponding DAC to adjust the output load of the DAC, change output power, and adjust a level of the harmonic cancellation.

8. An apparatus comprising:
   a frequency divider configured to divide a signal frequency to generate one or more equally spaced phases of the signal frequency;
   a power amplifier coupled to the frequency divider, respective amplifier stages of the power amplifier configured to receive the one or more phases of the signal frequency wherein the frequency divider is programmable to generate a plurality of signal frequencies and a plurality of phases at a fundamental frequency of the signal frequency respectively; and
   an output coupled to the respective amplifier stages of the power amplifier.

9. An apparatus of claim 8, wherein the power amplifier further comprises:
   a buffer configured to buffer the one or more phases of the signal frequency;
   one or more digital-to-analog converters (DAC) coupled to the buffer and configured to convert a digital representation of the one or more of the phases and the harmonics of the signal frequency into corresponding analog frequencies; and a capacitor coupled to the DACs and configured to filter the analog frequencies.

10. The apparatus of claim 9, wherein the DACs are further configured to provide a uniform load to each one of the plurality of phases at the fundamental frequency.

11. The apparatus of claim 10, where in the power amplifier is coupled to a power supply.

12. The apparatus of claim 11, wherein the power supply is a variable power supply and configured to one or more of:
change power supplied to corresponding DAC to adjust an output load of the DAC,
change output power, and
adjust a level of harmonic cancellation.

13. An apparatus comprising:
a frequency divider configured to divide a signal frequency to generate a plurality of equally spaced phases of the signal frequency;
a plurality of power amplifiers coupled to the frequency divider and configured to receive the plurality of phases of the signal frequency, amplify signal at the signal frequency and provide a uniform load to each one of the harmonics of the signal frequency, wherein the frequency divider is programmable to generate a plurality of signal frequencies and a plurality of phases at a fundamental frequency of the signal frequency respectively.

14. A device comprising:
circuitry enabled to:
receive a reference phasor signal at a fundamental signal frequency and one or more equally spaced phasors at the fundamental signal frequency;
provide uniform load to each one of the phasor at the fundamental signal frequency; and
cancel one or more harmonic frequencies of the fundamental signal frequency.

15. The device of claim 14, wherein the transceiver further comprising:
a power amplifier including:
one or more buffers configured to buffer one or more of the equally spaced phasors at the fundamental signal frequency; and
one or more digital-to-analog converters (DAC) coupled to the one or more buffers and configured to convert a digital representation of the one or more of the phasors at fundamental signal frequency into a corresponding output analog signal without harmonics.

16. The device of claim 15, wherein the DACs are further configured to provide uniform output load to one of the fundamental signal frequency and the one or more harmonic frequencies.

17. The device of claim 15, where in each one of the one or more DACS is coupled to a corresponding power supply.

18. The device of claim 17, wherein the power supply is a variable power supply and configured to one or more of:
change power supplied to corresponding DAC to adjust an output load of the DAC;
change an output power; and
adjust a level of harmonic cancellation.

19. A circuit comprising:
a frequency divider configured to divide a fundamental signal frequency to generate one or more phases of the fundamental signal frequency;
a first power amplifier coupled to the frequency divider and configured to receive the fundamental signal frequency;
a second power amplifier coupled to the frequency divider and configured to receive a first phasor of the fundamental signal frequency;
a third power amplifier coupled to the frequency divider and configured to receive a second phasor of the fundamental signal frequency; and
an output coupled to receive output signals from the first, second and third power amplifiers.

20. The circuit of claim 19, wherein a uniform output load is applied to one of the fundamental signal frequency, first phasor of the fundamental signal frequency, and second phasor of the fundamental signal frequency.

21. The circuit of claim 19, wherein a uniform output load is applied to the fundamental signal frequency, first phasor of the fundamental signal frequency, and second phasor of the fundamental signal frequency.

22. The circuit of claim 19, wherein a uniform output load is applied to the fundamental signal frequency, first phasor of the fundamental signal frequency, and second phasor of the fundamental signal frequency.

23. The circuit of claim 19, wherein harmonic combination of the fundamental signal frequency, first phasor of the fundamental signal frequency, and second phasor of the fundamental signal frequency occurs at the output.

24. A circuit comprising:
a frequency divider configured to divide a fundamental signal frequency to generate one or more phases of the fundamental signal frequency;
a first power amplifier coupled to the frequency divider and configured to receive the fundamental signal frequency;
a second power amplifier coupled to the frequency divider and configured to receive a phasor of the fundamental signal frequency; and
an output coupled to receive output signals from the first and second power amplifiers.

* * * * *